United States Patent
Lee et al.

(10) Patent No.: US 9,344,085 B2
(45) Date of Patent: May 17, 2016

(54) KEYPAD WITH OPTICAL SENSORS

(71) Applicant: RESEARCH IN MOTION LIMITED, Waterloo (CA)

(72) Inventors: Hsin Chin Lee, Waterloo (CA); Antanas Matthew Broda, Cambridge (CA); Amit Pal Singh, Waterloo (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 137 days.

(21) Appl. No.: 13/851,240

(22) Filed: Mar. 27, 2013

(65) Prior Publication Data
US 2014/0292658 A1 Oct. 2, 2014

(51) Int. Cl.
| | |
|---|---|
| G06F 3/042 | (2006.01) |
| H03K 17/96 | (2006.01) |
| G06F 3/01 | (2006.01) |
| G06F 3/02 | (2006.01) |
| H03K 17/94 | (2006.01) |
| H03K 17/969 | (2006.01) |
| H03K 17/98 | (2006.01) |

(52) U.S. Cl.
CPC ............ H03K 17/9629 (2013.01); G06F 3/017 (2013.01); G06F 3/0219 (2013.01); H03K 17/943 (2013.01); H03K 17/969 (2013.01); H03K 17/98 (2013.01); H03K 2217/96054 (2013.01)

(58) Field of Classification Search
USPC ............... 345/170, 175, 168, 169; 178/18.09, 178/19.05; 200/1 R, 181, 600, 52 R, 200/500–502, 573, 237, 5 A
See application file for complete search history.

(56) References Cited

U.S. PATENT DOCUMENTS

| | | | | |
|---|---|---|---|---|
| 4,480,183 | A * | 10/1984 | Ely et al. | 250/227.22 |
| 6,552,713 | B1 | 4/2003 | Van Brocklin et al. | |
| 7,728,316 | B2 * | 6/2010 | Fadell et al. | 250/559.38 |
| 2003/0117370 | A1 * | 6/2003 | Van Brocklin et al. | 345/156 |
| 2009/0046065 | A1 | 2/2009 | Liu et al. | |
| 2009/0167723 | A1 | 7/2009 | Kwong et al. | |
| 2011/0073456 | A1 * | 3/2011 | Chen | 200/5 A |
| 2011/0115652 | A1 | 5/2011 | Werner et al. | |
| 2011/0157094 | A1 | 6/2011 | Boer et al. | |
| 2012/0038674 | A1 * | 2/2012 | Stergiou et al. | 345/650 |
| 2012/0044146 | A1 | 2/2012 | Stewart et al. | |
| 2012/0050167 | A1 | 3/2012 | Krahenbuhl et al. | |
| 2012/0112998 | A1 | 5/2012 | Morris et al. | |
| 2012/0218187 | A1 | 8/2012 | Stewart et al. | |
| 2012/0256839 | A1 | 10/2012 | Suggs | |
| 2013/0127722 | A1 * | 5/2013 | Gu et al. | 345/166 |
| 2013/0314377 | A1 * | 11/2013 | Los | 345/175 |
| 2014/0028564 | A1 | 1/2014 | Valentine et al. | |
| 2014/0071327 | A1 * | 3/2014 | Brodie et al. | 348/335 |
| 2014/0176444 | A1 * | 6/2014 | Sultenfuss et al. | 345/168 |

FOREIGN PATENT DOCUMENTS

EP 1109127 A2 6/2001

OTHER PUBLICATIONS

Corresponding European Patent Application No. 13161406.7 Search Report dated Aug. 14, 2013.

* cited by examiner

*Primary Examiner* — Lun-Yi Lao
*Assistant Examiner* — Kelly B Hegarty
(74) *Attorney, Agent, or Firm* — Perry + Currier, Inc.

(57) ABSTRACT

A keypad with optical sensors is provided. The keypad comprises keycaps, each keycap having a top surface. One or more optical sensors are located beneath top surfaces of adjacent keycaps. One or more light guides extend from a respective optical sensor towards the top surfaces.

16 Claims, 12 Drawing Sheets

KEYPAD WITH OPTICAL SENSORS

FIELD

The specification relates generally to keypads, and specifically to a keypad with optical sensors.

BACKGROUND

The evolution of computers is currently quite active in the mobile device environment. Further, gesture based entry has become common place with touch screens, but less so with keypads.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
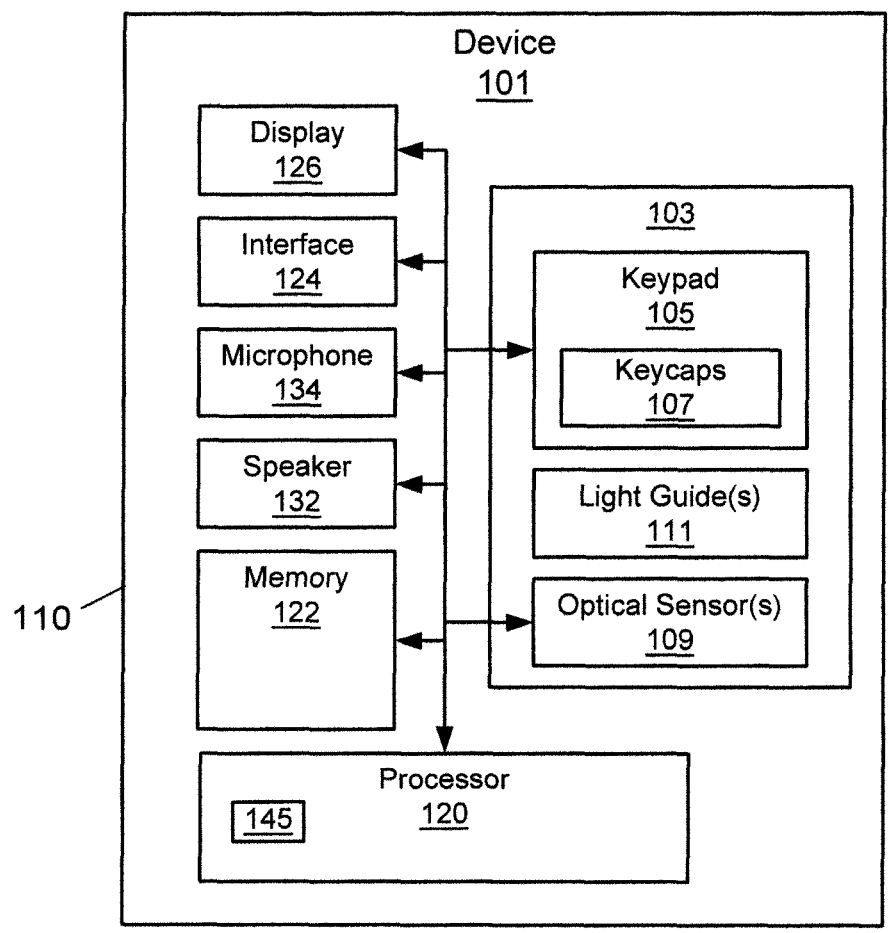
FIG. 1 depicts a schematic diagram of a device including a keypad with optical sensors, according to non-limiting implementations.

In this specification, elements may be described as "enabled to" perform one or more functions or "enabled for" such functions. In general, an element that is enabled to perform or enabled for performing a function is configured to perform the function, or is suitable for performing the function, or is adapted to perform the function, or is operable to perform the function, or is otherwise capable of performing the function.

An aspect of the specification provides a device comprising: a keypad having keycaps, each keycap having a top surface; one or more optical sensors located beneath top surfaces of adjacent keycaps; and, one or more light guides, each of the one or more light guides extending from a respective optical sensor towards the top surfaces.

Each of the one or more optical sensors can be located between respective adjacent keycaps.

The device can further comprise at least one decoration bar between the adjacent keycaps, the at least one decoration bar having the one or more light guides.

The device can further comprise at least one decoration bar between the adjacent keycaps, the at least one decoration bar separate from the one or more light guides.

The one or more light guides can be integrated with a decoration bar between the adjacent keycaps.

Each of the one or more optical sensors can comprise a combined light emitter and light sensor.

Each of the one or more optical sensors can comprise a light emitter and a light sensor, each of the one or more light guides configured to: channel light from the light emitter towards the top surfaces of the adjacent keycaps; and, channel the light reflected back to the light sensor for detection.

Each of the one or more optical sensors can comprise a light emitter and a light sensor, each of the one or more light guides having at least one lens configured to: disperse light from the light emitter; and, collect the light reflected back to the light sensor for detection. The at least one lens can be integrated with a decoration bar between the adjacent keycaps.

Each of the one or more optical sensors can comprise a light emitter and a light sensor, each of the one or more light guides having: a first convex lens configured to disperse light from the light emitter towards the top surfaces of the adjacent keycaps; and, a second convex lens configured to collect the light reflected back to the light sensor for detection, a first viewing angle of the first convex lens narrower than a second viewing angle of the second convex lens.

Each of the one or more light guides can extend to below the top surfaces of the adjacent keycaps.

Each of the one or more light guides can extend to about the same level as the top surfaces of the adjacent keycaps.

Each of the one or more light guides can extend to above the top surfaces of the adjacent keycaps.

A light emitting surface of each of the light guides can comprise one or more of a coating and an ink transparent to light emitted by the one or more optical sensors.

One or more optical sensors can be in communication with a processor configured to convert detection events at each of the one or more optical sensors to gesture based events at a display. The device can further comprise the processor and the display.

The one or more optical sensors can be arranged in a grid such that detection events at adjacent optical sensors that occur within a given time period can be converted to gesture based events at a display. The one or more optical sensors can comprise nine optical sensors arranged in a three-by-three grid.

The device can further comprise a telephonic device and at least one of the one or more optical sensors can be configured as a proximity detector when a call is received at the telephonic device.

Each of the one or more optical sensors can comprise an infrared light emitting diode (LED) and an infrared sensor.

Each of the one or more optical sensors can be located between adjacent actuation devices of the adjacent keycaps.

Each of the one or more optical sensors can replace at least a portion of a light blocking layer located between the keypad and a light configured to illuminate the keypad from underneath the keypad.

FIG. 1 depicts a device 101 that includes a device 103, according to non-limiting implementations. The device 103 comprises: a keypad 105 comprising keycaps 107, each keycap 107 comprising a top surface; one or more optical sensors 109 located beneath top surfaces of adjacent keycaps 107; and, one or more light guides 111, each of the one or more light guides 111 extending from a respective optical sensor 109 towards the top surfaces. In some implementations, one or more optical sensors 109 are located between adjacent keycaps 107. Details of device 103 will be described below with reference to FIGS. 2 to 5.

Device 101 further comprises a housing 110, which houses a processor 120 interconnected with: a memory 122; a communications interface 124 (referred to interchangeably hereafter as interface 124); a display 126; a speaker 132; and a microphone 134. Processor 120 is generally configured to communicate with one or more optical sensors 109 to determine when one or more detection events have occurred and convert the detection events to one or gesture based events, for example, at display 126. It is further appreciated that device 101, in some implementations, comprises a telephonic device; for example interface 124 combined with speaker 132 and microphone 134 can comprise a telephonic device for making calls. In these implementations, processor 120 can be configured to use one or more of optical sensors 109 as a proximity detector when a call is received at the telephonic device. Hence, one or more of optical sensors 109 can be used in different modes, depending on a current functionality of device 101.

FIG. 1 further depicts a schematic diagram of device 101, which will hereafter be described in further detail. It should be emphasized that the structure of device 101 in FIG. 1 is purely an example. For example, as depicted in FIG. 1, it is contemplated that device 101 comprises a device that can be used for implementing both wireless voice (e.g. telephony) and wireless data communications (e.g. email, web browsing, text, and the like), as well as any other specialized functions, including, but not limited, to one or more of, computing, and/or entertainment related functions.

Further, device 101 can be any type of electronic device that can be used in a self-contained manner, for example as a telephony device. Device 101 includes, but is not limited to, any suitable combination of mobile electronic devices, mobile communications devices, mobile computing devices, portable electronic devices, portable computing devices, portable navigation devices, laptop computing devices, tablet computing devices, telephones, PDAs (personal digital assistants), cellphones, smartphones, e-readers, internet-enabled appliances and the like.

Device 101 comprises device 103, which can generally comprise an input device generally configured to receive input data. Device 103 can generally comprise any suitable combination of a keyboard, a keypad, and a pointing device and the like. Indeed, as will presently be described, device 103 combines keyboard functionality of keypad 105 with pointing device and/or gesture-based input functionality of one or more optical sensors 109.

Device 101 can further comprise other input devices generally configured to receive input data, and can comprise any suitable combination of other input devices, including but not limited to a keyboard, a keypad, a pointing device, a mouse, a track wheel, a trackball, a touchpad, a touch screen and the like. Other input devices are within the scope of present implementations.

Input from device 103 and/or other input devices are received at processor 120 (which can be implemented as a plurality of processors, including but not limited to one or more central processors (CPUs)). Processor 120 is configured to communicate with a memory 122 comprising a non-volatile storage unit (e.g. Erasable Electronic Programmable Read Only Memory ("EEPROM"), Flash Memory, and the like) and a volatile storage unit (e.g. random access memory ("RAM"), and the like). Programming instructions that implement the functional teachings of device 101 as described herein are typically maintained, persistently, in memory 122 and used by processor 120 which makes appropriate utilization of volatile storage during the execution of such programming instructions. In some implementations, processor 120 comprises at least a portion of memory 122, for example as on-board random access memory (RAM). It is further appreciated that memory 122 is an example of computer readable media that can store programming instructions executable on processor 120. Furthermore, memory 122 is also an example of a memory unit and/or memory module.

Processor 120 can be further configured to communicate with display 126, microphone 134 and speaker 132. Display 126 comprises any suitable one of, or combination of, CRT (cathode ray tube) and/or flat panel display (e.g. LCD (liquid crystal display), plasma, OLED (organic light emitting diode), capacitive or resistive touch screens, and the like). Microphone 134 comprises a microphone for receiving sound data at device 101. Speaker 132 comprises a speaker for providing sound data, audible alerts, audible communications from remote communication devices, and the like, at device 101. Processor 120 can also control one or more of display 126 and speaker 132 to provide notifications, for example of phone calls.

Interface 124 (and/or another communications interface, not depicted) can be implemented as one or more radios and/or connectors and/or network adaptors, configured to wirelessly communicate with one or more communication networks (not depicted). It will be appreciated that, in these implementations, interface 124 can be configured to correspond with network architecture that is used to implement one or more communication links to the one or more communication networks, including but not limited to any suitable combination of USB (universal serial bus) cables, serial cables, wireless links, cell-phone links, cellular network links (including but not limited to 2G, 2.5G, 3G, 4G+, UMTS (Universal Mobile Telecommunications System), CDMA (Code division multiple access), WCDMA (Wideband CDMA), FDD (frequency division duplexing), TDD (time division duplexing), TDD-LTE (TDD-Long Term Evolution), TD-SCDMA (Time Division Synchronous Code Division Multiple Access) and the like), wireless data links, Bluetooth links, NFC (near field communication) links, WiFi links, WiMax links, packet based links, the Internet, analog networks, the PSTN (public switched telephone network), access points, and the like, and/or a combination. When interface 124 is configured to communicate with one or more communication networks, interface 124 can comprise further protocol specific antennas there for (not depicted).

It is appreciated that interface 124, speaker 132 and microphone 134 together comprise a telephony device for making and receiving calls.

Housing 110 can comprise any housing, casing, and the like, which can be optionally configured to be at least one of held and carried by a human hand. In general, housing 110 houses the components of device 101; however some components can be visible via apertures, windows and the like in housing 110. For example, display 126 is generally visible.

While not depicted, it is yet further appreciated that device 101 comprises a battery and/or a power pack, or any other suitable power source including, but not limited to, a connection to a mains power supply.

In any event, it should be understood that a wide variety of configurations for device 101 are contemplated.

In some implementations, device 101 need not be a mobile device but rather device 101 can comprise a computing device, including but not limited to a personal computer, and the like.

Furthermore, device 103 can comprise a stand-alone device separate from device 101, including, but not limited to a stand-alone keyboard. In these implementations, device 101 is further configured to communicate with device 103 via a wired and/or wireless link, interface and the like, such that device 101 can receive input data from device 103.

Figure 2:
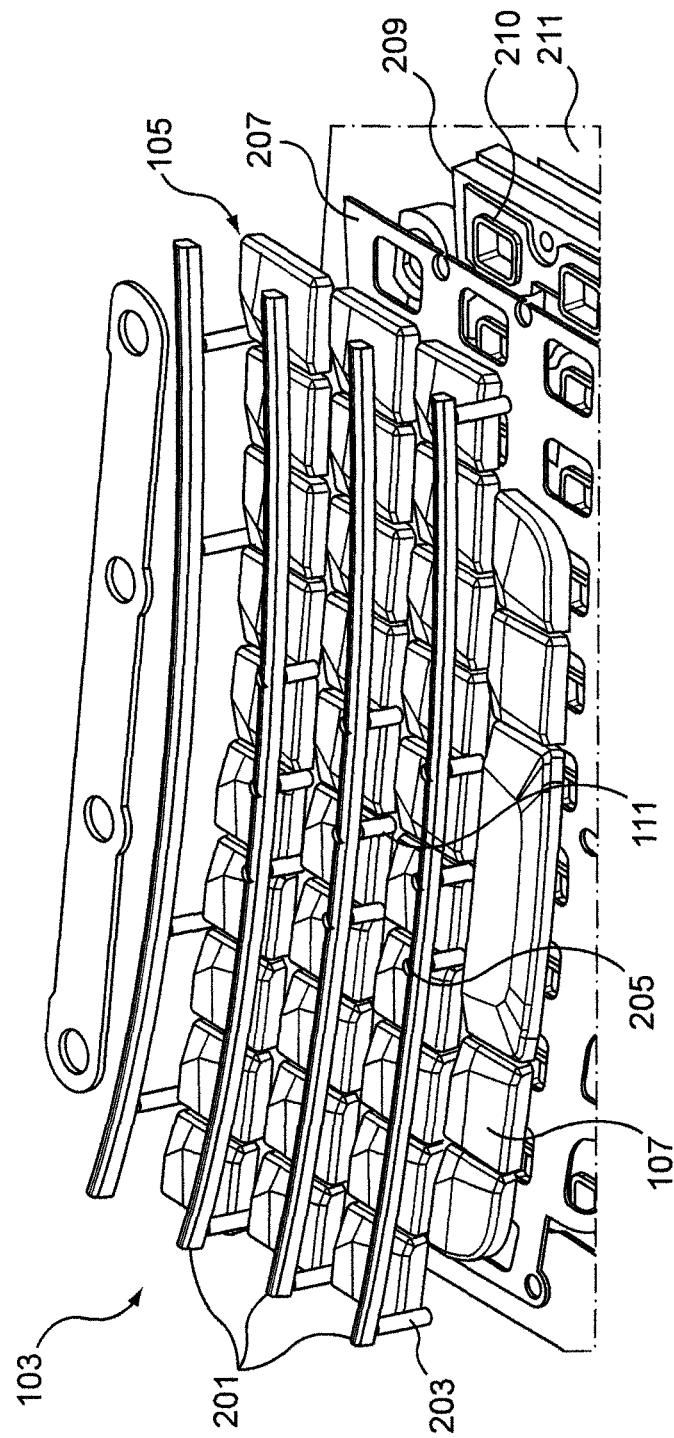
FIG. 2 depicts a partially exploded perspective view of the keypad of FIG. 1, according to non-limiting implementations

Attention is next directed to FIG. 2 which depicts a partially exploded perspective view of device 103. Keypad 105 comprises a plurality of keycaps 107 arranged in rows, only one of which is labelled for clarity, keypad 105 generally comprising a QWERTY keyboard, or the like, adapted for a mobile device. In depicted implementations, device 103 further comprises optional decoration bars 201 that extend across device 103 between one or more of adjacent keycaps 107 and adjacent rows of keycaps 107. Decoration bars 201 can also provide a touch based guide to positions of rows of keycaps 107. Each of decoration bars 201 can further comprise one or more positioning rods 203, or the like, for positioning each decoration bar 201 in device 103, only one of which is labeled in FIG. 2 for clarity; for example, each positioning rod 203 can be received in a complimentary aperture configured to retain a respective positioning rod 203, and hence further retain a respective decoration bar 201.

One or more of decoration bars 201 can further comprise integrated light guides 111 (the entirety of which are not visible in FIG. 2), as described below with reference to FIG. 9, each light guide 111 comprising a lens 205 integrated with decoration bar 201. It is appreciated that in FIG. 2, each light guide 111 appears similar to positioning rods 203, however, light guides 111 may not be directly retained by a complimentary aperture; rather light guides 111 are generally configured to channel light to and from optical sensors 109, as described below with reference to FIGS. 4 and 5.

Device 103 can further comprise an optional light blocking layer 207, including but not limited to a blocking foil, located between keypad 105 and an optional light (not depicted) configured to illuminate keypad 105 from underneath keypad 105. In these implementations, keycaps 107 can be at least partially transparent (for example a character, not depicted, on each keycap 107 can be configured to transmit light) such that keycaps 107 can be illuminated from underneath using the light, for example in low ambient light conditions. In these implementations, light blocking layer 207 blocks illumination from the light between keycaps 107.

Device 103 can further comprise a frame 209 that includes biasing mechanisms 210 for biasing keycaps 107 to a rest position. Hence, when a keycap 107 is depressed, for example when input is being received via device 103, biasing mechanisms 210 cause a respective keycap 107 to return to a rest position. Frame 209 and/or biasing mechanisms 210 can comprise any suitable material and/or structure, including, but not limited to silicone, rubber, polycarbonate (PC), light guide material, light guide plate, light guide foil, light guide rubber, and the like and/or combinations thereof.

Figure 3:
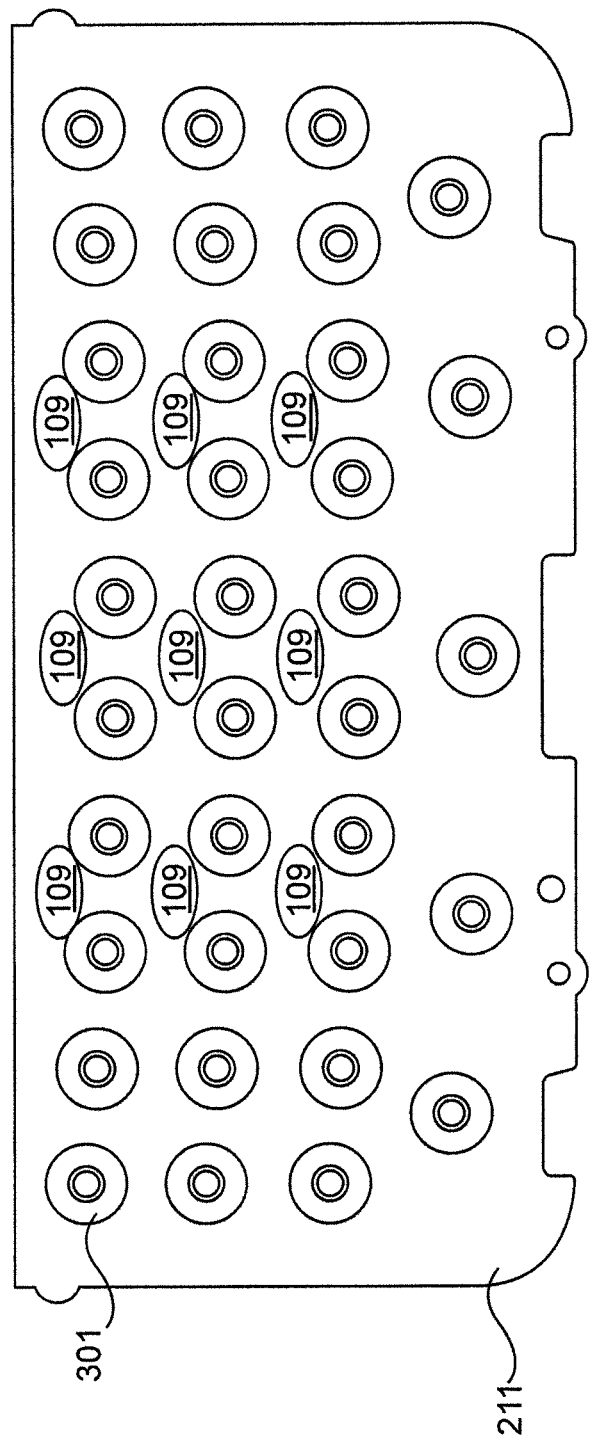
FIG. 3 depicts a perspective view of a layer of the keypad of FIG. 1 that includes optical sensors, according to non-limiting implementations.

Device 103 further comprises a layer 211 comprising actuation devices (not visible in FIG. 2, however see actuation devices 301 of FIG. 3). Layer 211 can include, but is not limited to a printed circuit board (PCB), a flex board, a flexible printed circuit board (FPC) and the like. Further, layer 211 can include one or more lights, light emitting diode (LEDs) and the like for illuminating keycaps 107, as described above.

Attention is next directed to FIG. 3 which depicts aspects of layer 211 in more detail. In general, layer 211 comprises actuation devices 301 that are located under each keycap 107. When a given keycap 107 is depressed, a respective actuation device 301 is actuated, which registers at processor 120 as input data respective to the depressed given keycap 107. Hence, actuation devices 301 are located and provided in a one-to-one relationship with keycaps 107. Actuation devices 301 can include, but are not limited to, switches, mechanical switches, dome switches, flex switches, electronic switches, capacitive switches, optical switches and the like.

Layer 211 further comprises one or more optical sensors 109 located, for example, between adjacent actuation devices 301 of adjacent keycaps 107. In depicted non-limiting implementations, optical sensors 109 are arranged in a grid such that detection events at adjacent optical sensors 109 can be converted to gesture based events, for example by processor 120 for use at display 126. Specifically, in depicted implementations, one or more optical sensors 109 comprise nine optical sensors arranged in a three-by-three grid. Use of the grid will be described below with reference to FIG. 7. While not depicted it is appreciated that each optical sensor 109 in the grid will have an associated light guide 111. It is further apparent from FIG. 3 that optical sensors 109 may be discrete from one another.

It is yet further apparent that one or more of optical sensors 109 can replace at least a portion of light blocking layer 207 located between keypad 105 and a light configured to illuminate keypad 105 from underneath keypad 105. In other words, light blocking layer 207 will comprise apertures for accommodating optical sensors 109 such that light from optical sensors 109 can be channeled to keypad 105 and/or through keypad 105.

Figure 4:
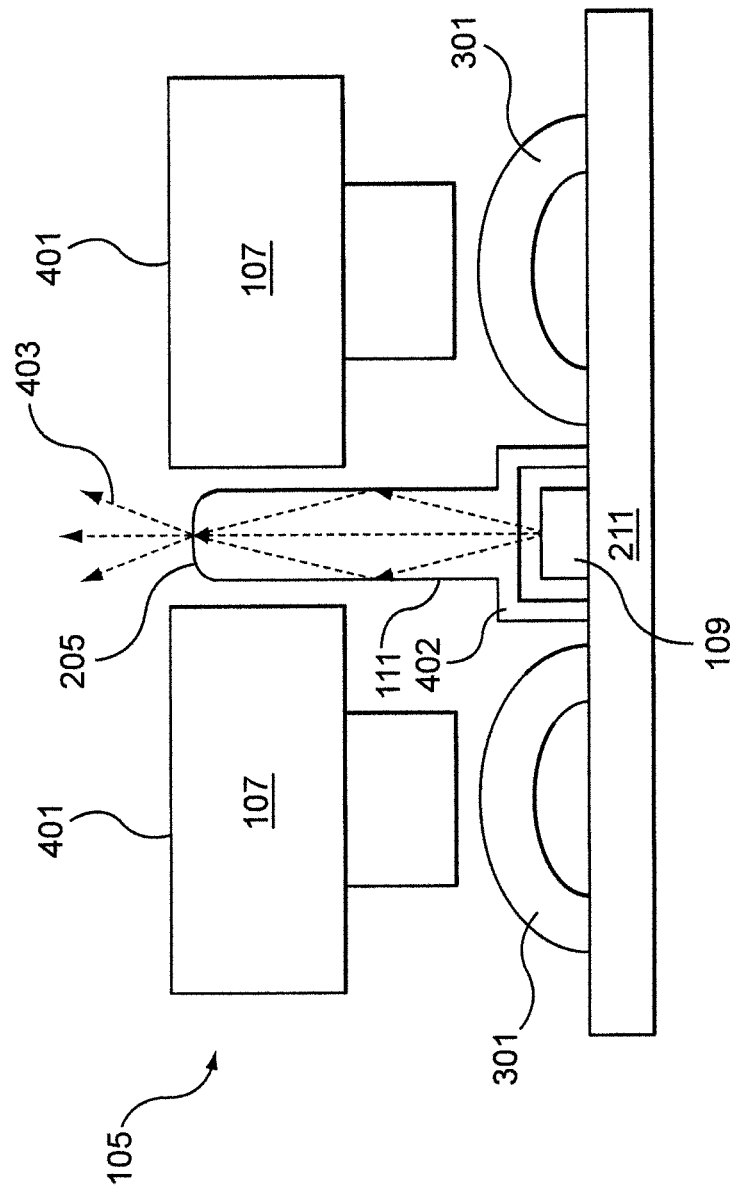
FIG. 4 depicts a schematic cross-sectional view of the keypad of FIG. 2 emitting light for detection, according to non-limiting implementations.

Attention is next directed to FIG. 4, which depicts a partial cross-sectional view of two adjacent keycaps 107, an associated optical sensor 109 and light guide 111, as well as layer 211 and associated actuation devices 301. Each keycap 107 comprises a respective top surface 401, which can also be interchangeably referred to as a contact surface as, generally, when a user is actuating a given keycap 107, the user contacts top surface 401 to depress keycap 107 to cause actuation of a respective actuation device 301.

From FIG. 4 it is apparent that, in these implementations, optical sensor 109 is located between adjacent keycaps 107 and beneath top surfaces 401 of adjacent keycaps 107. Furthermore, light guide 111 extends from optical sensor 109 towards the top surfaces 401. In depicted implementations, light guide 111 extends to below top surfaces 401 of adjacent keycaps 107. However, in other implementations, light guide 111 extends to about a same level as top surfaces 401 of adjacent keycaps 107. In yet further implementations, light guide 111 extends to above top surfaces 401 of adjacent keycaps 107. Hence, each of light guides 111 can extend to one of: below top surfaces 401 of adjacent keycaps 107; about a same level as top surfaces 401 of adjacent keycaps 107; and above top surfaces 401 of adjacent keycaps 107.

In other implementations, optical sensors 109 could be located beneath layer 211 with apertures therein, with light guides 111 extending through the apertures to channel light between optical sensors 109 and keypad 105. Furthermore, in these implementations, optical sensors 109 can be located anywhere under layer 211 with light guides 111 configured to channel light between respective optical sensors 109 and keypad 105. In other words, while as depicted each light guide 111 comprises a rod, as well as an optional integrate cover 402 for each optical sensor 109, in other implementations a light guide 111 can have any shape for channeling light between a location of a respective optical sensor 109 and one or more of tops of keycaps 107 and keypad 105. Further, light guides 111 can comprise one or more of rigid and flexible light guides. Light guide 111 can comprise plastic and the like, including plastic and/or material adapted for use as light guide, that is at least transparent to light emitted from optical sensors 109 including, but not limited to, light guide material, light guide rubber, light guide foil, polycarbonate, Polymethylmethacrylate (PMMA), acrylonitrile butadiene styrene (ABS) and the like, and/or combinations thereof. It is further appreciated that a shape of each light guide 111 is such that total internal reflection occurs at side walls of each light guide 111 to reduce light leakage of each light guide 111, other than at ends of each light guide 111.

It is appreciated that each optical sensor 109 comprises a light emitter and a light sensor, which can be combined together in one device as a combined light emitter and a light and/or be separate devices. In implementations depicted in FIG. 4, optical sensor 109 comprises a combined light emitted and light sensor.

In some implementations, optical sensor 109 comprises: an infrared light emitter, including, but not limited to, an infrared light emitting diode (LED); and an infrared light sensor including, but not limited to, an infrared photodetector.

In any event, optical sensor 109 emits light 403 using the light emitter, and light guide 111 is configured to channel light 403 from light emitter towards top surfaces 401 of adjacent keycaps 107 and/or towards keypad 105, such that light 403 emerges from between adjacent keycaps 107. Hence, it is appreciated that an end of light guide 111 located at keypad 105 can comprise a lens 205 configured to disperse light 403 from the light emitter, for example outwards from a plane defined by top surfaces 401. Lens 205 can comprise a convex lens.

Figure 5:
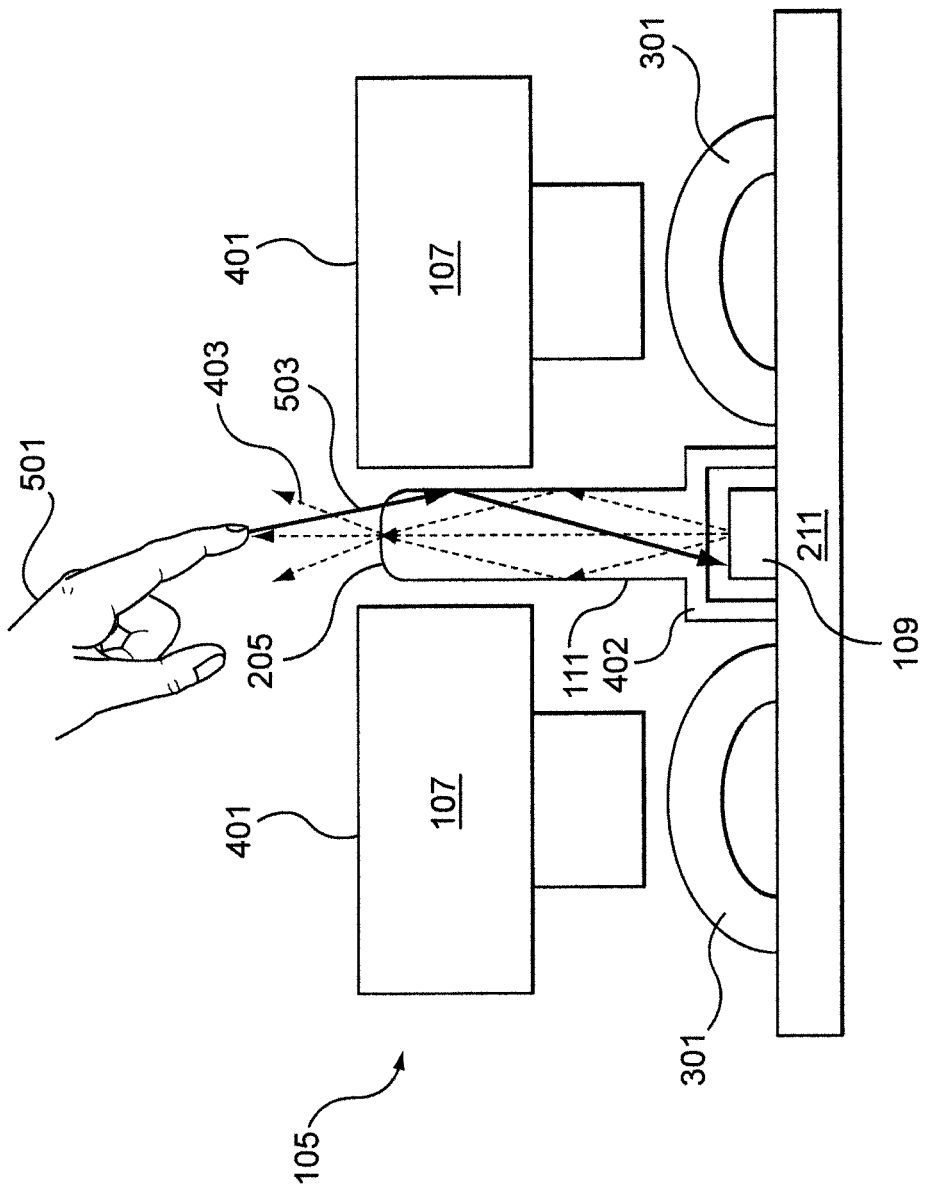
FIG. 5 depicts a schematic cross-sectional view of the keypad of FIG. 2 receiving light for detection, according to non-limiting implementations.

Attention is now directed to FIG. 5, which is substantially similar to FIG. 4, with like elements having like numbers. However, in FIG. 5, a finger 501 of a user is adjacent keypad 105 and/or keycaps 107 and is causing light 403 to be reflected back to light guide 111. Reflected light 503 is received at light guide 111 which channels light 503 reflected back to optical sensor 109. Hence, it is appreciated that lens 205 is further configured to collect light 503 reflected back to optical sensor 109 for detection, for example by the light sensor. Optical sensor 109 hence detects light 503 and one or more of a detection event, a detection signal and detection data is produced.

It is further appreciated that as finger 501 moves across device 103, more than one of optical sensors 109 can detect light reflected back to respective optical sensors 109 by finger 501, and hence a position of finger 501 can be tracked across device 103 by detecting light detection events at successive light guides 111.

Figure 6:
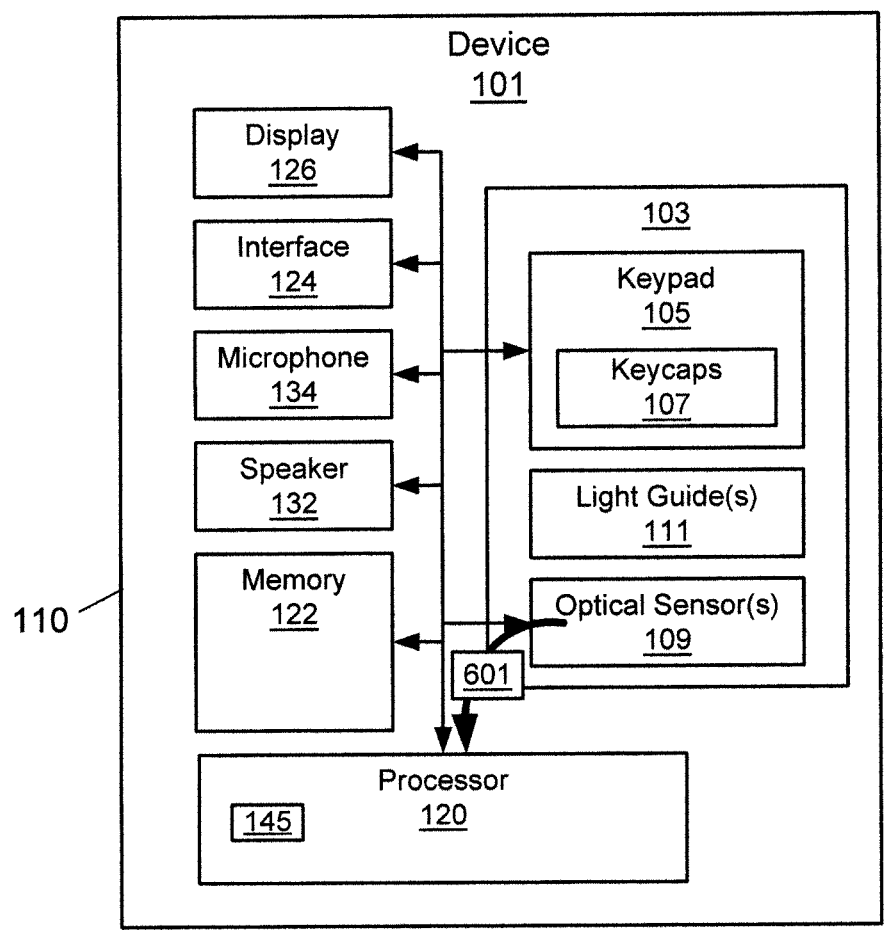
FIG. 6 depicts a detection event occurring at an optical sensor of the device of FIG. 1, according to non-limiting implementations.

For example, as depicted in FIG. 6, which is substantially similar to FIG. 1, with like elements having like numbers, one or more optical sensors 109 are in communication with processor 120, processor 120 can be configured to receive a one or more indications 601 of detection events at one or more of optical sensors 109, and convert detection events at each of one or more optical sensors 109 to gesture based events, for example at display 126. Alternatively, processor 120 can detect gesture based events based on detection of detection events at successive light guides 111, for example within a given time period.

Figure 7:
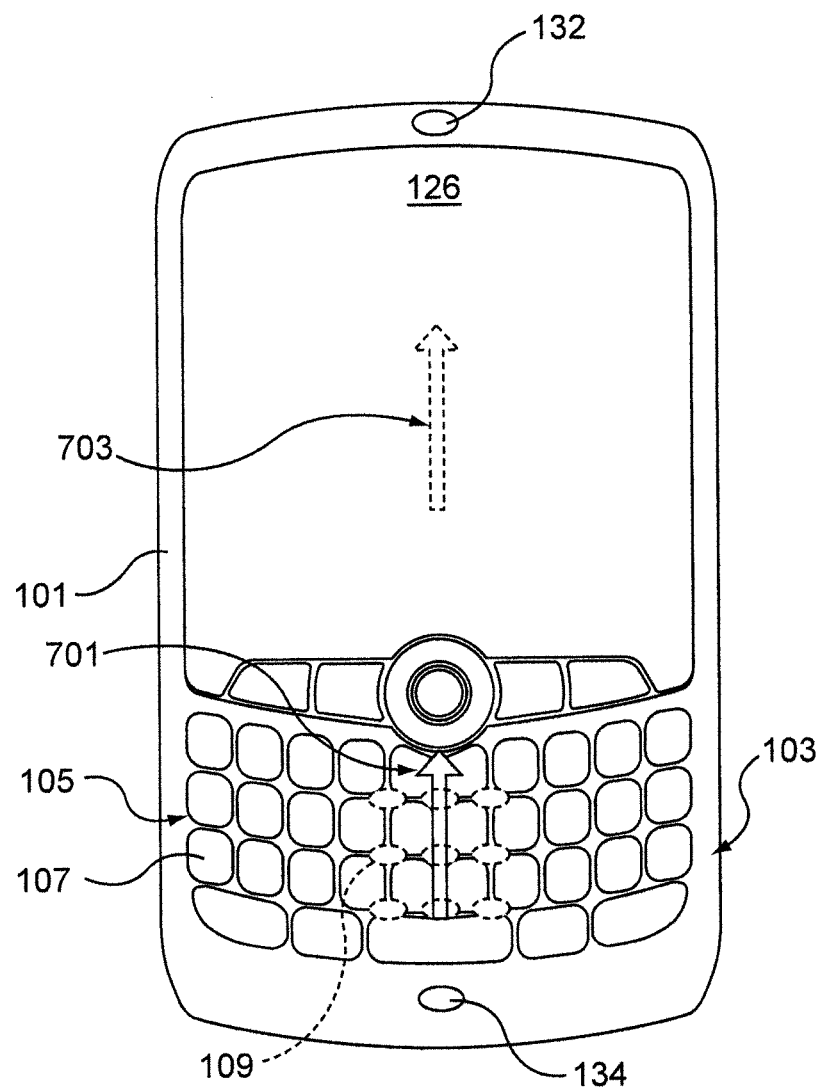
FIG. 7 depicts a perspective view of the device of FIG. 1 when a gesture based event is detected at the optical sensors, according to non-limiting implementations.

For example, attention is next directed to FIG. 7 which depicts a front perspective view of device 101 including device 103, keypad 105, keycaps 107 and display 126, as well as speaker 132 and microphone 134. It is appreciated that decoration bars 201 and lenses 205 are not depicted for clarity, but can nonetheless be present at keypad 105 between rows of keycaps 107.

Positions of optical sensors 109 are depicted relative to keycaps 107, though only one of each is numbered for clarity. Furthermore, optical sensors 109 are drawn in stippled lines as optical sensors 109 may not be fully visible, but are located beneath top surfaces 401 of adjacent keycaps 107; however a portion of optical sensors 109 may be visible as generally there can be space between keycaps 107. It is further appreciated that the configuration of optical sensors 109 in FIG. 7 is similar to the configuration of optical sensors 109 in FIG. 3, in that optical sensors 109 are arranged in a three-by-three grid.

Arrow 701 of FIG. 7 shows a path of a finger of a user when device 103 is being used as a gesture based input device, in that the user will swipe a finger upwards across the middle of keypad 105 such that optical sensors 109 will track a position of the finger across device 103. The user can use lenses 205, which can be raised from decoration bars 201, as guides to positions of optical sensors 109.

Processor 120 will receive an indication of a detection event from successive optical sensors 109, as in FIG. 6 and convert the detection events to a gesture based event, for example, at display 126, as indicated by arrow 703. In other words, device 103 can be used to receive and/or detect gesture based events including, but not limited to, swipe events and the like at device 103.

In some implementations, processor 120 is configured to convert successive detection events to a gesture based event only when the successive detection events occur within a given time period including, but not limited to, less than or about equal to about one second. Restricting the conversion of successive detection events to gesture based events to successive detection events that occur within the given time period can reduce instances of false detection of gesture based events.

In any event, device 103 can hence be used for gesture based events such as scrolling, swiping, and the like at display 126, as well as for keyboard entry. In some implementations successive detection events at optical sensors 109 that occur in a specific sequence can be used to one or more of unlock and lock device 101 and/or device 103 and/or display 126.

Further, while only an upwards gesture based event is depicted, it is appreciated that using a three-by-three grid of optical sensors, processor 120 can detect gesture based events that are one or more of downwards, left-to-right, right-to-left, and diagonal.

Figure 8:
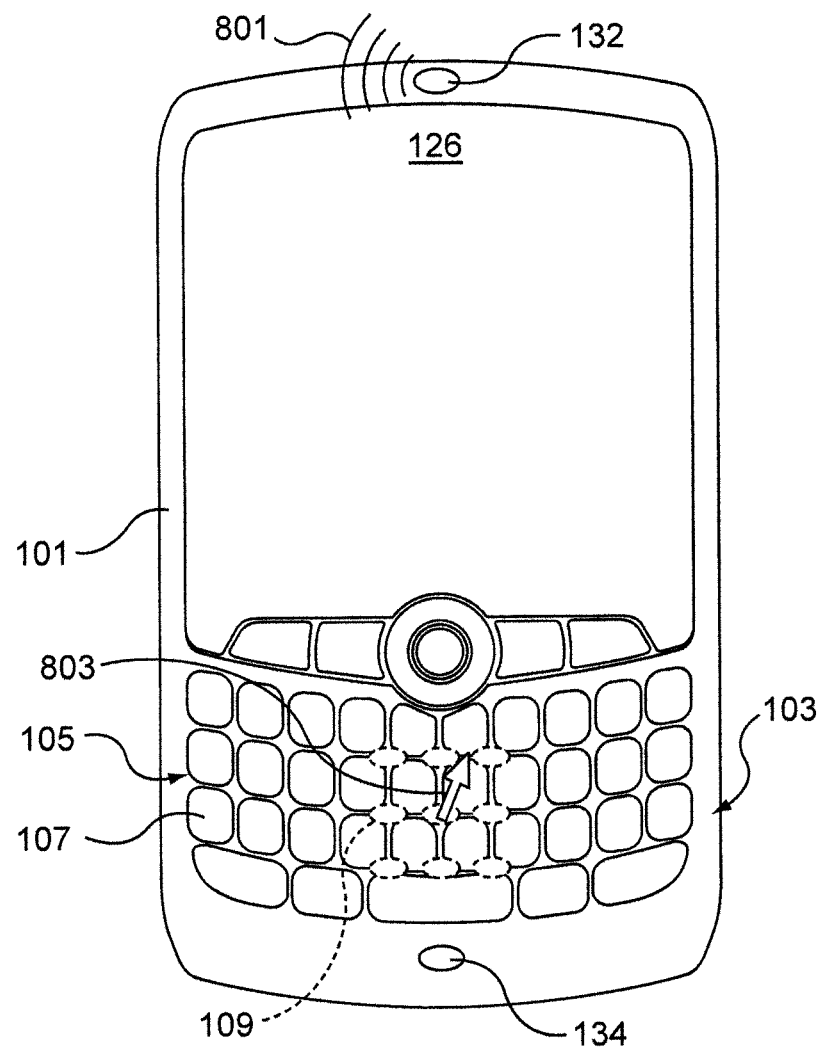
FIG. 8 depicts a perspective view of the device of FIG. 1 with at least one of the optical sensors configured as a proximity detector when a call is received, according to non-limiting implementations.

However, use of optical sensors 109 are not limited to detection of gesture based events. For example, attention is next directed to FIG. 8, which is substantially similar to FIG. 7, with like elements having like numbers. As described above, it is appreciated that device 101 comprises a telephonic device in the form of at least interface 124, speaker 132 and microphone 134. In FIG. 8, device 101 is receiving a call, as indicated by an aural notification 801 provided at speaker 132 (i.e. device 101 is "ringing" to announce the call, however other notifications are within the scope of present implementations).

In these implementations, at least one of the one or more optical sensors 109 can be configured as a proximity detector when a call is received at the telephonic device. For example, as depicted, a center optical sensor 109 in the three-by-three grid can be turned on to emit light 803 when a call is received. When light 803 is reflected back to one or more of optical sensors 109 after one or more of receiving the call and answering the call (for example within a given time period after answering the call), processor 120 can determine that: a detection event has occurred at one or more of optical sensors 109, as in FIG. 6, and hence proximity has been detected at one or more of optical sensors 109. In other words, a user can be holding device 101 to his or her face in order to use speaker 132 and microphone 134 during the call, and the user's face causes light 803 to be reflected back to one or more optical sensors 109; proximity of the user's face is thereby detected. Processor 120 can be configured to, in response, place device 101 into a call answered mode, in which, for example, display 126 is turned off and/or any touch input at the display 126 is disabled until proximity is no longer detected at one or more of optical sensors 109.

In some implementations, only optical sensors 109 that emit light 803 for proximity detection are correspondingly configured to detect reflected light, while in other implementations only a subset of optical sensors 109 can be configured to emit light 803 for proximity detection, while another subset of optical sensors 109 can be correspondingly configured to detect reflected light.

Figure 9:
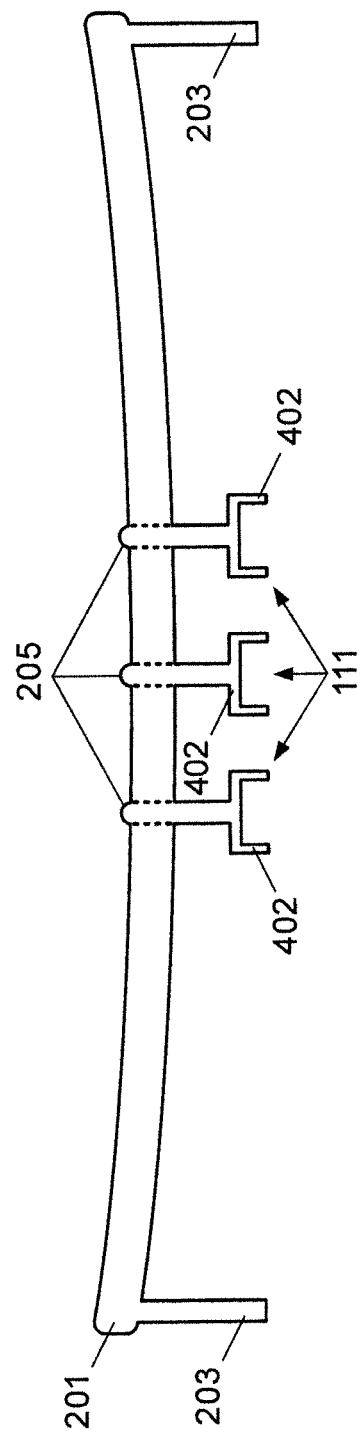
FIG. 9 depicts a side view of a decoration bar with integrated light guides, for use with the device of FIG. 1, according to non-limiting implementations.

Attention is next directed to FIG. 9, which depicts a non-limiting implementation of a decoration bar 201. Decoration bar 201 comprises positioning rods 203, or the like, for positioning each decoration bar 201 in device 103, as described above.

Decoration bar 201 further comprises one or more light guides 111 integrated therewith, each light guide 111 comprising a lens 205 and an optional cover 402 for a respective optical sensor 109 (not depicted). Hence, lens 205 and optional covers are also integrated with decoration bar 201.

Furthermore, light guides 111 and the remainder of decoration bar 201 can comprise the same or different materials; for example, light guides 111 can comprise a transparent plastic (e.g. adapted for use as a light guide) and the remainder of decoration bar can comprise an opaque plastic, the two plastics fused together during manufacturing. Either way, each light guide 111 is configured to channel light from a respective optical sensor 109 (not depicted in FIG. 9) to a respective lens 205, and channel reflected light received at a respective lens 205 to a respective optical sensor 109.

Further, a light emitting surface of each of light guides 111, for example lens 205, can comprise one or more of a coating and an ink transparent to light emitted by the one or more optical sensors 109, including, but not limited to an infrared transparent coating and/or ink, for example to match a colour of the remainder of decoration bar 201.

Figure 10:
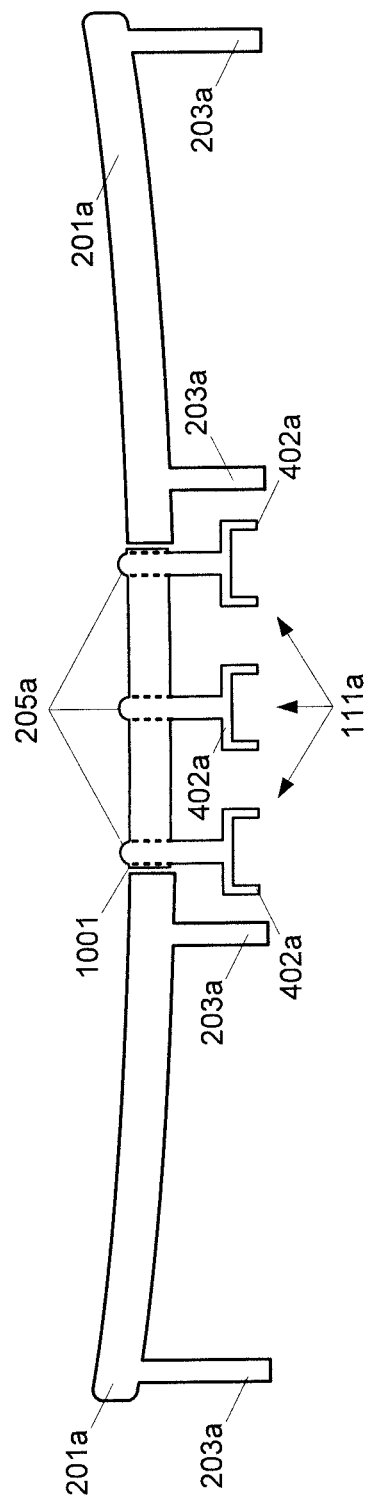
FIG. 10 depicts a side view of a decoration bar and separate integrated light guides, for use with the device of FIG. 1, according to non-limiting implementations.

However, light guides 111, need not be integrated with a decoration bar 201. For example, attention is directed to FIG. 10 which depicts an alternative implementation of a decoration bar 201a comprising positioning rods 203a, similar to positioning rods 203. Indeed, decoration bar 201a is similar to decoration bar 201, however decoration bar 201a comprises two sections. Further, each section of decoration bar 201a comprises at least two positioning rods 203a to provide each section of decoration bar 201a stability in device 103; it is appreciated that in these implementations, it is assumed that device 103 comprises complementary apertures to retain each rod 203a. It is apparent from FIG. 10 that light guides 111a are separate from decoration bar 201a. For example light guides 111a, including respective lenses 205a (similar to lenses 205) and optional covers 402a, can be integrated into a piece 1001 which can be installed separately from pieces of decoration bar 201a at device 103. While not depicted piece 1001 can also comprise positioning rods similar to positioning rods 203a. Further piece 1001 and decoration bar 201a can comprise different or similar materials, similar to light guides 111 and decoration bar 201.

Figure 11:
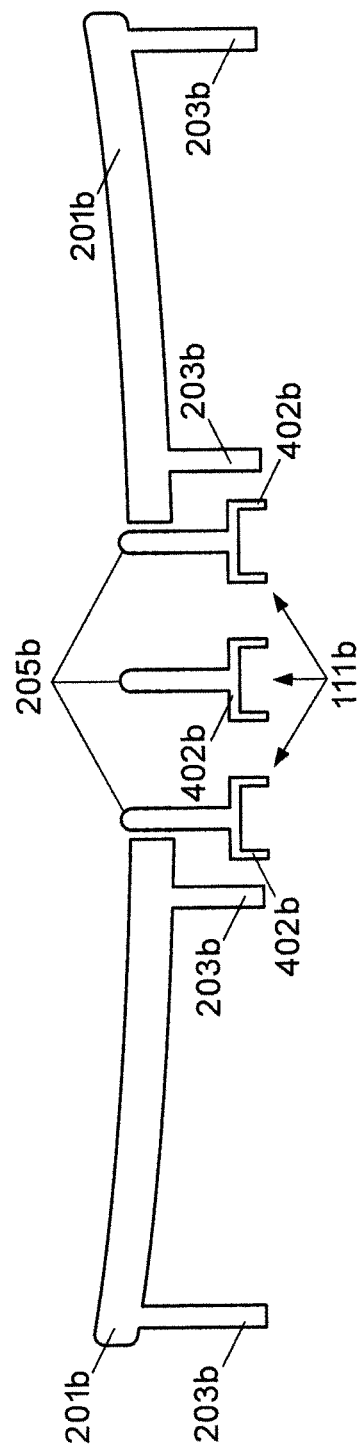
FIG. 11 depicts a side view of a decoration bar and separate light guides, for use with the device of FIG. 1, according to non-limiting implementations.

Attention is next directed to FIG. 11, which shows yet a further implementation of a decoration bar 201b and light guides 111b. In these implementations, decoration bar 201b is similar to decoration bar 201a, and comprises positioning rods 203b similar to positioning rods 203a. However, each light guide 111b is separate from each other light guide 111b and are installed separately from each other, each light guide 111b comprising a respective lens 205b and a respective optional cover 402b.

Figure 12:
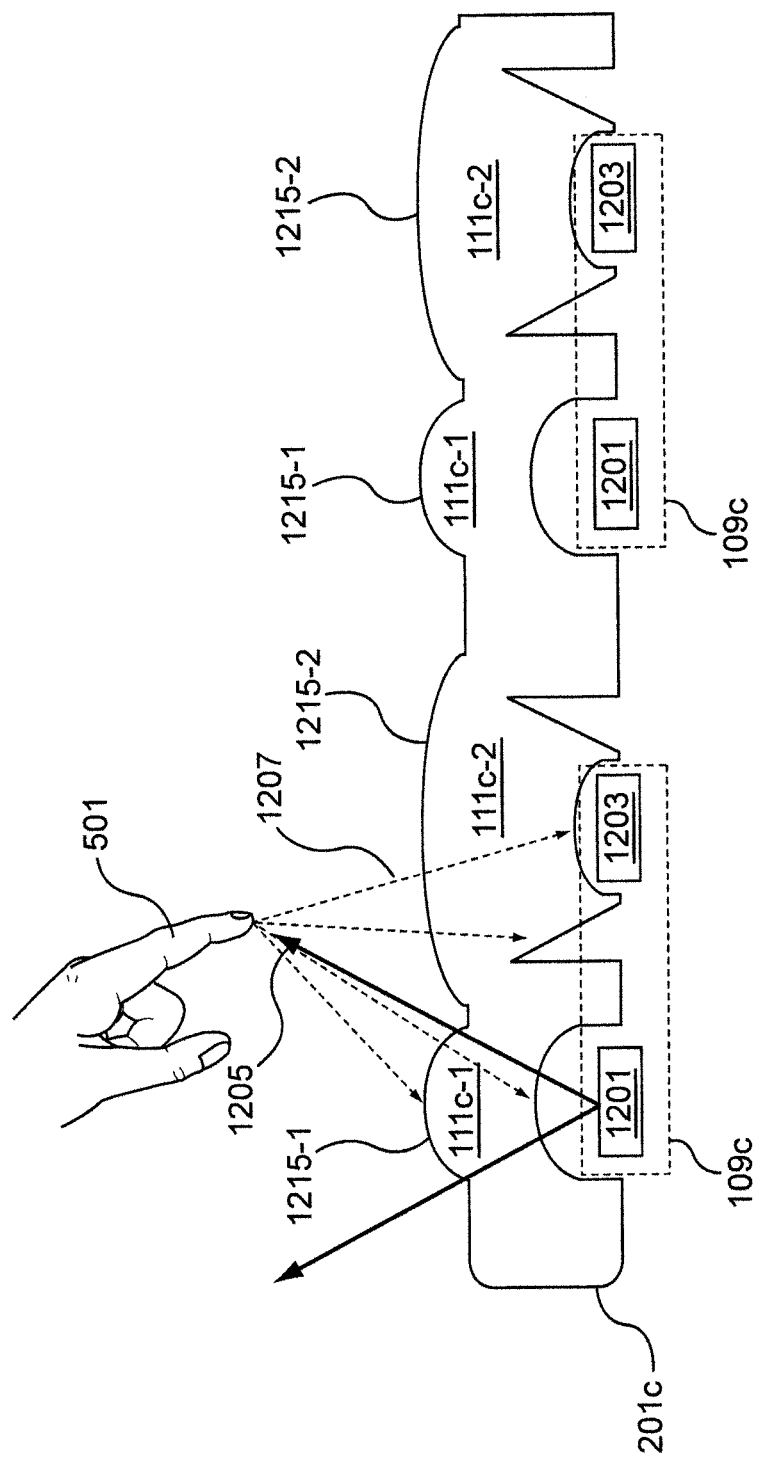
FIG. 12 depicts a partial side view of a decoration bar with integrated light guides in use with optical sensors of the device of FIG. 1, according to non-limiting implementations.

Heretofore optical sensors 109 have been described comprising respective light emitters and respective light sensors combined into single device. However, attention is next directed to FIG. 12, which depicts a portion of a cross-section of an alternative non-limiting implementation of a decoration bar 201c in use with alternative optical sensors 109c, each optical sensor 109c comprising a respective light emitter 1201 and a separate respective light sensor 1203. While only two optical sensors 109c are depicted, it is appreciated that one or more of optical sensors 109c can be integrated with one or more of device 103 and device 101, as with optical sensors 109.

In any event, in these implementations, each light emitter 1201 and each light sensor 1203 is provided with a respective light guide 111c-1, 111c-2, which can be integrated with decoration bar 201c, as depicted, or provided as separate light guides, similar to light guides 111b. In yet further implementations, adjacent light guides 111c-1, 111c-2 can be combined as an integrated light guide. Further, while only two pairs of adjacent light guides 111c-1, 111c-2 are depicted, it is appreciated that a pair of adjacent light guides 111c-1, 111c-2 is provided for each optical sensor 109 and/or each light emitter 1201/light sensor 1203 pair.

Light guides 111c-1 are provided for use with light emitters 1201, to channel light 1205 from light emitters 1201 towards top surfaces 401 of adjacent keycaps (not depicted in FIG. 12); similarly, light guides 111c-2 are provided for use with light sensors 1203 to channel light 1207 reflected back to a respective light sensor 1203 for detection. For example, finger 501 reflects light 1205 back to light sensor 1203 as reflected light 1207.

Further light guides 111c-1 each comprise a first convex lens 1215-1 configured to disperse light 1205 from light emitter 1201 towards the top surfaces of the adjacent keycaps. Light guides 111c-2 each comprise a second convex lens 1215-2 configured to collect light 1207 reflected back to light sensor 1203 for detection, a first viewing angle of first convex lens 1215-1 narrower than a second viewing angle of second convex lens 1215-2, such that light 1205 is dispersed over a narrower angle than a collection angle of convex lens 1215-2.

Each light guide 111c-1, 111c-2 further comprises a hollow space above each respective light emitter 1201 and light sensor 1203 to act as a cover for each respective light emitter 1201 and light sensor 1203. Each hollow can be concave and/or at least partially spherical such that light 1205, 1207 impinging thereon generally has a normal angle of incidence to reduce reflection there from.

Further side walls of each of light guides 111c-1, 111c-2 can be adapted to increase transmission of light 1205, 1207 there through; for example, side walls of light guide 111c-1 are generally perpendicular to an emitting surface of each light emitter 1201 such that total internal reflection is likely to occur at each sidewall. Similarly, side walls of light guides 111*c*-2 are at a non-perpendicular angle to a detecting surface of light sensor 1203 to better channel light 1207 entering convex lens 1215-2 thereto. Further, in depicted implementations, the side walls of each of light guides 111*c*-1, 111*c*-2 are at least partially separated to reduce the risk of cross-talk there between.

In any event, provided herein are implementations of a device that includes a combination of a keypad and optical sensors such that the keypad can be used to receive keypad input, and as a gesture based input device. Further, as detection events at the optical sensors are based on light reflected from an object adjacent to the keypad, a gloved finger can be used to interact with the optical sensors, in contrast to capacitive based touch pads where a conductive surface must be used to interact therewith; in other words, in present implementations a user can wear gloves to interact with the optical sensors to enter gesture based input, whereas with a capacitive touch pad, touch screens and the like, the user must use bare hands to enter touch gesture based input. Hence, present implementations can be integrated with a device that has both a keypad and a touch screen based display to provide an alternate gesture based input device, which can be particularly useful with mobile devices used in cold climates. It is yet further appreciated that present implementations are also less sensitive to conducting surface contaminants, such as water, than are capacitive touch pads and/or touch screens.

Those skilled in the art will appreciate that in some implementations, the functionality of device 101 can be implemented using pre-programmed hardware or firmware elements (e.g., application specific integrated circuits (ASICs), electrically erasable programmable read-only memories (EEPROMs), etc.), or other related components. In other implementations, the functionality of device 101 can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

A portion of the disclosure of this patent document contains material which is subject to copyright protection. The copyright owner has no objection to the facsimile reproduction by any one of the patent document or patent disclosure, as it appears in the Patent and Trademark Office patent file or records, but otherwise reserves all copyrights whatsoever.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A device comprising:
 a display;
 a keypad having keycaps, each keycap having a top surface;
 a plurality of optical sensors located beneath top surfaces of adjacent keycaps, the plurality of optical sensors are arranged in a grid, each of the plurality of optical sensors located between respective adjacent keycaps;
 a plurality of light guides, each of the plurality of light guides extending from a respective optical sensor towards the top surfaces;
 at least one decoration bar between the adjacent keycaps, the at least one decoration bar including the plurality of light guides; and,
 a processor in communication with the plurality of optical sensors and the display, the processor configured to convert detection events at adjacent optical sensors that occur within a given time period to gesture based events at the display.

2. The device of claim 1, wherein each of the plurality of optical sensors are located between respective adjacent keycaps.

3. The device of claim 1, wherein the the at least one decoration bar is separate from the plurality of light guides.

4. The device of claim 1, wherein the plurality of light guides are integrated with the decoration bar between the adjacent keycaps.

5. The device of claim 1, wherein each of the plurality of optical sensors comprises a combined light emitter and light sensor.

6. The device of claim 1, wherein each of the plurality of optical sensors comprises a light emitter and a light sensor, each of the plurality of light guides configured to:
 channel light from the light emitter towards the top surfaces of the adjacent keycaps; and,
 channel the light reflected back to the light sensor for detection.

7. The device of claim 1, wherein each of the plurality of optical sensors comprises a light emitter and a light sensor, each of the plurality of light guides having at least one lens configured to:
 disperse light from the light emitter; and,
 collect the light reflected back to the light sensor for detection.

8. The device of claim 7, wherein the at least one lens is integrated with the decoration bar between the adjacent keycaps.

9. The device of claim 1, wherein each of the plurality of optical sensors comprises a light emitter and a light sensor, each of the plurality of light guides having:
 a first convex lens configured to disperse light from the light emitter towards the top surfaces of the adjacent keycaps; and,
 a second convex lens configured to collect the light reflected back to the light sensor for detection, a first viewing angle of the first convex lens narrower than a second viewing angle of the second convex lens.

10. The device of claim 1, wherein each of the plurality of light guides extends to one of: below the top surfaces of the adjacent keycaps; about the same level as the top surfaces of the adjacent keycaps; or above the top surfaces of the adjacent keycaps.

11. The device of claim 1, wherein a light emitting surface of each of the light guides comprises one or more of a coating and an ink transparent to light emitted by the plurality of optical sensors.

12. The device of claim 1, wherein the plurality of optical sensors comprises nine optical sensors arranged in a three-by-three grid.

13. The device of claim 1, further comprising a telephonic device and wherein at least one of the plurality of optical sensors is configured as a proximity detector when a call is received at the telephonic device.

14. The device of claim 1, wherein each of the plurality of optical sensors comprises an infrared light emitting diode (LED) and an infrared sensor.

15. The device of claim 1, wherein each of the plurality of optical sensors is further located between adjacent actuation devices of the adjacent keycaps.

16. The device of claim 1, wherein each of the plurality of optical sensors replaces at least a portion of a light blocking layer located between the keypad and a light configured to illuminate the keypad from underneath the keypad.

* * * * *